United States Patent
Chamorovskiy et al.

(10) Patent No.: US 8,624,579 B2
(45) Date of Patent: Jan. 7, 2014

(54) FIBER OPTIC CURRENT SENSOR

(75) Inventors: Yuri Chamorovskiy, Zavodskaya (RU);
Vladimir Gubin, Vokzalnaya (RU);
Sergei Morshnev, Vokzalnaya (RU);
Yan Prziyalkovskiy, Moscow (RU);
Maxin Ryabko, Dolgoprudniy (RU);
Nikolay Starostin, Mira (RU);
Alexander Sazonov, Mira (RU); Anton Boyev, Sofrino (RU)

(73) Assignee: Closed Joint Stock Company "Profotech" (CJSC "Profotech"), Moscow (RU)

( * ) Notice: Subject to any disclaimer, the term of this patent is extended or adjusted under 35 U.S.C. 154(b) by 0 days.

(21) Appl. No.: 13/519,749

(22) PCT Filed: Dec. 28, 2010

(86) PCT No.: PCT/IB2010/056091
§ 371 (c)(1),
(2), (4) Date: Jun. 28, 2012

(87) PCT Pub. No.: WO2011/080696
PCT Pub. Date: Jul. 7, 2011

(65) Prior Publication Data
US 2012/0286767 A1 Nov. 15, 2012

(30) Foreign Application Priority Data

Dec. 29, 2009 (RU) ................ 2009148729

(51) Int. Cl.
*G01R 31/00* (2006.01)
(52) U.S. Cl.
USPC ..... 324/96; 324/244.1; 324/304; 324/750.23; 385/12; 385/11; 385/15; 385/25; 385/42; 250/227.17; 250/227.18; 356/364; 356/365; 356/465; 356/477

(58) Field of Classification Search
USPC ........ 324/96, 244.1, 750.23, 304; 385/12, 11, 385/15, 25, 31, 42; 356/364, 365, 465; 250/227.17, 227.18
See application file for complete search history.

(56) References Cited

U.S. PATENT DOCUMENTS 4,370,612 A * 1/1983 Puech et al. ............... 324/117 R
4,372,685 A * 2/1983 Ulrich ........................... 356/464
(Continued)

FOREIGN PATENT DOCUMENTS

WO 00/31551 A1 6/2000

*Primary Examiner* — Arleen M Vazquez
*Assistant Examiner* — Thang Le
(74) *Attorney, Agent, or Firm* — Nath, Goldberg & Meyer; Jerald L. Meyer; Lakshmi Rajan

(57) ABSTRACT

A Fiber-optic current sensor for sensing electric current carried in an electric conductor (18). Its optical section comprises: a light source (1); a directional coupler (2) with two ports (2A, 2B) of two arms each; a radiation polarizer (3); a polarization modulator (4); a fiber line (17) coupled to a current-sensing fiber loop (11); a mirror (10); and a photodetector (22). The first port of the coupler (2) is coupled to the light source (1) and to the photodetector (22). Its second port is coupled via the radiation polarizer (3) to the polarization modulator (4). The polarization modulator comprises a magneto-sensitive element (5), around which a solenoid (6) is wound. The fiber loop (11) comprises a magneto-sensitive optical fiber with embedded linear birefringence. An electronic section comprises a signal generator (21) which drives the solenoid (6); and a signal processing unit which receives the optical signal from the photodetector (22).

6 Claims, 3 Drawing Sheets

(56) References Cited

U.S. PATENT DOCUMENTS

| | | | |
|---|---|---|---|
| 4,563,639 A * | 1/1986 | Langeac | 324/96 |
| 5,056,885 A * | 10/1991 | Chinn | 385/13 |
| 5,115,127 A * | 5/1992 | Bobb et al. | 250/227.19 |
| 5,479,094 A * | 12/1995 | Esman et al. | 324/96 |
| 5,568,049 A | 10/1996 | Bucholtz | |
| 5,589,933 A * | 12/1996 | Osgood et al. | 356/73.1 |
| 5,764,046 A * | 6/1998 | Bosselmann | 324/96 |
| 6,188,811 B1 * | 2/2001 | Blake | 385/12 |
| 6,301,400 B1 * | 10/2001 | Sanders | 385/12 |
| 6,534,977 B1 * | 3/2003 | Duncan et al. | 324/244.1 |
| 2009/0002712 A1 * | 1/2009 | Huang | 356/477 |

* cited by examiner

FIBER OPTIC CURRENT SENSOR

This is a National Phase Application filed under 35 U.S.C. 371 as a national stage of PCT/IB2010/056091, filed Dec. 28, 2010, and claims priority from Russian Application No. 2009148729, filed Dec. 29, 2009, the content of each of which is hereby incorporated by reference in its entirety.

FIELD OF THE INVENTION

The present invention relates to fiber optic current sensors and to techniques for sensing an electric current by using a fiber optic current sensor.

BACKGROUND OF THE INVENTION

Known fiber-optic current sensors operate on the principle of Faraday effect. The current flowing in an electric conductor (wire) induces a magnetic field, which through the Faraday effect rotates the plane of radiation polarization propagating in an optical fiber wound around the current-carrying wire. According to the theorem of magnetic field circulation, the following is obtained:

$$\oint Hdl = I \quad [1]$$

Herein I denotes the electrical current, H denotes the magnetic field and the integral is taken along a closed path around the current-carrying wire. If the sensitive fiber with constant sensitivity along the length to the magnetic field is wound around the wire, with the current as a circuit with an integral number of turns N, then the plane rotation of radiation polarization at the circuit's output depends on the current in the wire and is independent of all external magnetic fields generated. Such external magnetic fields include, for instance, currents generated by adjacent wires. A rotation angle of the polarization plane is equal to:

$$\phi = V \oint Hdl = VNI \quad [2]$$

Herein V denotes the Verdet constant for the fiber material, which may be silica, quartz, glass or polymer, for example. The sensitive optical fiber performs a linear integration of the magnetic field along its path; the integral is proportional to the current in the wire when this path is closed on itself. Rotation of the radiation polarization plane due to the presence of electric current is measured by the introduction of radiation with linear polarization in the sensing fiber loop, and subsequent analysis of the state of polarization after it gets out of the fiber loop. From a physical point of view, polarization plane rotation is caused by the fact that the two circularly polarized in opposite directions and equal in magnitude radiation components, the sum of which forms a linearly polarized radiation, have different propagation velocity in the sensing fiber located in a longitudinal magnetic field, which—after passing through the sensitive fibers—results in the appearance of (Faraday) phase shift between them, equal to $$\phi_F = 2\phi \quad [3]$$

In current-sensing applications, wherein the state of circular polarization is indicative of the current being measured, the sensitive fiber should maintain the state of circular polarization.

Fiber-optic current sensors measure an angle of rotation $\phi$, or equivalently, a phase shift $\phi_F$. A well-known instrument for measuring current is a reciprocal reflective optical interferometer, an example of which is disclosed in reference document [1] (Laming et al.). This prior art instrument includes a measurement sensing fiber loop made of a sensitive optical fiber connected to a polarizer on the one end of the fiber and to a light reflector (mirror) on the other. Between the polarizer and the sensitive circuit, a beam splitter (directional coupler) is installed to branch the radiation to the device for analyzing rotation of light polarization plane after passing through the sensing fiber, first forward and then, after reflection from the mirror, backward. Sensitive optical fibers can be categorized into two types. The first type includes the optical fiber with very low linear birefringence (LB type), the second—magnetically sensitive optical fibers with embedded linear birefringence (spun fiber). The second type of fiber is obtained by drawing of a preform with a strong built-in (embedded) linear birefringence and a rotation of this preform during drawing process. In the present context, a preform means material that has undergone preliminary shaping but is not yet in its final form. As disclosed in reference document [1], the sensing loop of the current sensor employs a magneto-sensitive fiber with embedded linear birefringence.

Reference document [2] (U.S. Pat. No. 6,188,811) discloses a fiber-optic current sensor, which includes a light source, a polarizer coupled with the light source, a piezoelectric or electro-optical modulator of radiation polarization coupled with the polarizer, a fiber maintaining the linear polarization of radiation ("PM fiber") and combined with the polarization modulator, a polarization-maintaining quarter-wave plate connected to the PM fiber, a magneto-sensitive fiber with embedded linear birefringence (spun fiber) combined with the quarter-wave plate, which to a large degree preserves the state of circular polarization, an output reflector coupled with the aforementioned magneto-sensitive fiber, and a photodetector with an output coupled with the polarizer. The magneto-sensitive fiber forms a sensing loop around the wire with flowing current.

FIG. 1A of said U.S. Pat. No. 6,188,811 shows an example of a linear current sensor. Light from a light source propagates through a coupler and a polarizer to a 45-degree splice, where it divides equally into the two polarization states maintained throughout the rest of the optical circuit. A piezoelectric birefringence modulator differentially modulates the phases of the light for the two polarization states. The piezoelectric birefringence modulator is driven by a modulator signal generator that provides an electrical, periodic, alternating signal having the shape of a square wave or sine wave. The light then propagates through a delay line and through a mode converter, which converts the two linear states of polarization into two circular states of polarization, and through an optimized sensor coil. The optimized sensor coil is wound around the current carrying wire. The light reflects off a reflective termination and retraces its way through the optical circuit, finally arriving at a photodetector. An open-loop signal processor converts the detected signal to an output, which is indicative of the current flowing in the current carrying wire. The sensor achieves its greatest sensitivity when the circular states of polarization are well maintained throughout the sensing coil. It is well known in the art that a spun birefringent fiber can preserve a circular state of polarization to some degree. For the invention disclosed in reference document [2], the concern is that the circular state of polarization be extraordinarily well maintained so that a very long length (hundreds of meters) of sensing fiber can be used. A straight spun birefringent fiber does hold a circular state of polarization over a long distance, but achieving this property is much more difficult when the fiber is bent, as is done when it is wrapped around a current carrying wire.

As stated in said U.S. Pat. No. 6,188,811, to obtain a high sensitivity of the sensor, the circular polarization state should be well maintained throughout the sensing circuit. It is well known in the art that a direct spun fiber is capable of maintaining the state of circular polarization over lengths of hundreds of meters. However, with a bend radius of less than about 20 mm, the sensitivity of the known fibers rapidly drops. For a given length of magneto-sensitive fibers, an increase in the allowable number of fiber turns in the circuit, and hence the sensor sensitivity, is limited. The fiber-optic sensors described in U.S. Pat. No. 6,188,811 overcome many of the shortcomings inherent in traditional single continuous fiber sensors. However, certain issues remain that affect the accuracy of the sensor. For example, to obtain very accurate measurements, optical components, in particular the quarter-wave plate should be ideal and not susceptible to external influences such as temperature alterations and mechanical disturbances. It is well established that the ideal or nearly ideal quarter-wave plates are difficult and very expensive to produce in order to achieve accurate reading required in certain applications. Known piezoelectric and electro-optical modulators have a residual level of parasitic modulation, which reduces the accuracy of the sensor. For effective modulation of known optical systems, a considerable length of PM fiber (up to 1 km) in the delay line is required. An associated problem is that PM fiber is expensive.

In addition, there is a need for fiber-optic current sensors of very high sensitivity. For instance, in some applications it is required to control small leakage currents in the lines with high rated currents, such as underground cables.

Finally, one of the problems in known fiber-optic current sensors is the dependence of magneto-optical sensitivity of the fiber loop on the external temperature and mechanical stress on the fiber. This dependence limits the accuracy of the sensor in the presence of these effects and requires a complex set of protective measures for sensitive circuits.

SUMMARY OF THE INVENTION

It is an object of the present invention to alleviate one or more of the above-identified problems, such as the influence on environmental conditions on various elements of the current-sensing system. For instance, the environmental conditions may include temperature fluctuations and mechanical forces, such as stress and/or vibration. The influenced elements may include elements of the fiber loop, such as the fiber itself, a quarter-wave plate, optical couplers, etc. This object is achieved by the apparatuses according to the attached independent claims. The dependent claims and the detailed description and drawings relate to specific exemplary embodiments, which provide additional features and/or solve additional problems. Such embodiments will be presented for the purposes of illustrating the invention but not for restricting it. In particular, it is worth noting that the quarter-wave plate, which is a significant source of temperature-related instability, can be omitted in typical embodiments of the present invention.

An aspect of the invention is a fiber-optic current sensor for sensing an electric current carried in an electric conductor, the fiber-optic current sensor comprising an optical section and an electronic section. The optical section comprises a light source; a directional coupler with a first port and second port, each port comprising a first arm and a second arm; a radiation polarizer with a first port and a second port; a polarization modulator with a first port and a second port, a fiber line coupled to a current-sensing fiber loop having a first end and a second end; a radiation reflector; and a photodetector.

One arm of the first port of the directional coupler is coupled to the light source while the other arm of the first port of the directional coupler is coupled to the photodetector. One arm of the second port of the directional coupler is coupled to the first port of the radiation polarizer. The second port of the radiation polarizer is coupled to the first port of the polarization modulator. The polarization modulator comprises a magneto-sensitive element, around which a solenoid is wound. The current-sensing fiber loop is made of magneto-sensitive optical fiber with an embedded linear birefringence. Finally, the electronic section comprises a signal generator configured to drive the solenoid; and a signal processing unit configured to receive an optical signal from the photodetector.

Benefits of the invention include increased sensitivity and precision of the fiber optic current sensor. These benefits are obtained by virtue of the reduced sensitivity of the elements of the current-sensing system to environmental conditions, such as temperature and/or mechanical stress or vibration.

The magneto-sensitive element may comprise a modulator fiber segment or a modified magnetic garnet optical element, eg an isolator, in which the permanent magnet, which is conventionally used, is replaced by the solenoid which carries the modulation current.

Reference document [2] (U.S. Pat. No. 6,188,811) discloses a fiber-optic current sensor in which the fiber line comprises a delay line and a mode converter for converting two linear states of polarization into two circular states of polarization.

Some additional benefits are achieved by embodiments in which the fiber line is a bifilar fiber line having a first port with a first arm and second arm and a second port with a first arm and a second arm; the second port of the polarization modulator is coupled to the first arm of first port of the bifilar fiber line; the first and second arms of the second port of the bifilar fiber line are respectively coupled to the first end and second end of the current-sensing fiber loop; the second arm of the first port of the bifilar fiber line is coupled to the radiation reflector. For instance, this embodiment renders the delay line and mode converter superfluous. In addition, this embodiment is capable of a highly efficient construction in which the modulator fiber segment forms a unitary fiber with the bifilar line and the current-sensing fiber loop.

For optimal sensitivity and best immunity against external influences, such as temperature variations and bending-induced stress, the magneto-sensitive optical fiber with embedded linear birefringence should have an embedded beat length $L_b$ from 1 mm to 10 mm and a spinning pitch $L_{sp}$ from 1 mm to 5 mm.

BRIEF DESCRIPTION OF THE DRAWINGS

Specific embodiments of the invention will be described in connection with the attached drawings, in which.

DETAILED DESCRIPTION OF SPECIFIC EMBODIMENTS

Figure 1:
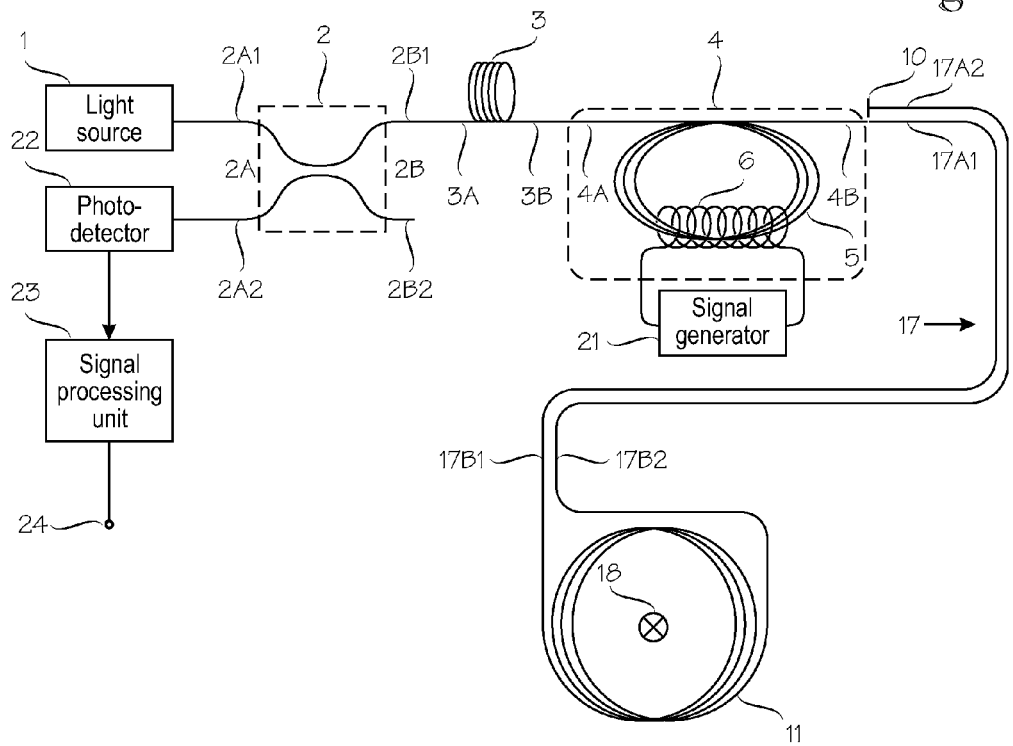
FIG. 1 shows a first embodiment of the invention.

FIG. 1 shows a first embodiment of the present invention. The overall layout shown in FIG. 1 is largely similar to the layout shown in FIG. 1A of U.S. Pat. No. 6,188,811, and a detailed description of the common elements is largely superfluous. A departure from the prior art is seen in the fact that the piezoelectric birefringence modulator used in the prior art has been replaced by a magneto-optical polarization modulator 4 which comprises a modulator fiber segment 5, around which a solenoid 6 is wound. The modulator fiber segment 5 is shown as a multi-turn fiber coil, but other implementations are possible, as will be shown in more detail in the following.

Specifically, FIG. 1 shows a fiber-optic current sensor for sensing an electric current carried in an electric conductor 18. The fiber-optic current sensor comprises an optical section and an electronic section. The optical section comprises a light source 1; a directional coupler 2, a radiation polarizer 3, a polarization modulator 4, a fiber line 17 coupled to a current-sensing fiber loop 11, a radiation reflector 10 (such as a mirror), and a photodetector 22. One arm 2A1 of the first port of the directional coupler 2 is coupled to the light source 1, while the other arm 2B1 of the first port of the directional coupler 2 is coupled to the photodetector 22. One arm 2B1 of the second port of the directional coupler 2 is coupled to the first port 3A of the radiation polarizer. The second port 3B of the radiation polarizer is coupled to the first port 4A of the polarization modulator 4. The polarization modulator 4 comprises a modulator fiber segment 5, around which a solenoid 6 is wound. The modulator fiber segment 5 is made of magneto-sensitive optical fiber with an embedded linear birefringence. Similarly to the modulator fiber segment 5, the current-sensing fiber loop 11 may also be made of magneto-sensitive optical fiber with an embedded linear birefringence.

The fiber optic current sensor shown in FIG. 1 operates as follows. Optical radiation from the light source 1, which is preferably a broadband light source, is introduced in the first arm 2A1 of the first port 2A of the directional coupler 2, and from the first arm 2B1 of the second port 2B, the radiation is transferred to input 3A of the polarizer 3. On the other arm 2B2 of the directional coupler 2, the radiation is absorbed. The second arm 2A2 of the first port 2A of the directional coupler 2 is coupled to the photodetector 22 receiving the optical radiation as it returns from the optical interferometer. At its output 3B, the polarizer 3 has optical radiation with a high linear polarization of the electric field, which can be presented as the sum of two circularly polarized optical components with opposite directions of rotation of the electric field. The radiation from the polarizer output 3B reaches the fiber loop 5 of the polarization modulator 4. The fiber loop 5 comprises one or more passes, eg turns, of magneto-sensitive fiber with embedded linear birefringence. The fiber loop passes through the solenoid 6, such that the wire turns of the solenoid penetrate the plane in which the fiber loop is laid. Auxiliary current to the solenoid 6 is produced by signal generator 21. Optical radiation passing through the modulator fiber loop 5 acquires a shift in the azimuth of linear polarization, proportional to the auxiliary current in the solenoid due to the Faraday effect. The above current can be sinusoidal, for example, and it provides a periodic modulation of the azimuth of the electric field. Such a modulator design allows obtaining a modulation mode for the interferometer with a short base. In other words, this type of modulation mode does not require a long delay line, in contrast to the prior art, in which the delay line (shown as item 15) is a mandatory element. This modulation scheme also eliminates or reduces concomitant parasitic modulation, which reduces the accuracy of current sensors. After the modulator 4, operation of the embodiment shown in FIG. 1 is largely similar to the one shown in FIG. 1A of the prior art (reference document 2).

The embodiment shown in FIG. 1 employs an electromagnetic modulator as the polarization modulator 4. Thus the magneto-sensitive features of the optical fiber are used in the polarization modulator 4 as well as in the current sensing loop 11. A benefit of this feature is that a single continuous optical fiber can be used for the polarization modulator 4 and the current sensing loop 11, which reduces the number of optical joints.

FIG. 1 shows an embodiment of the invention, in which a bifilar line 17 is employed to solve some further residual problems of the prior art. In the embodiment shown in FIG. 1, the fiber line 17 is a bifilar fiber line having a first port with a first arm 17A1 and second arm 17A2 and a second port with a first arm 17B1 and a second arm 17B2. The second port 4B of the polarization modulator is coupled to the first arm 17A1 of first port of the bifilar fiber line 17. The first and second arms 17B1, 17B2 of the second port of the bifilar fiber line 17 are respectively coupled to the first end and second end of the current-sensing fiber loop 11, and the second arm 17A2 of the first port of the bifilar fiber line 17 is coupled to the radiation reflector 10.

In this configuration, the optical radiation is received at the first arm 17A1 of the first port of the bifilar fiber line 17. From the first arm 17B1 of the second port of the bifilar fiber line 17, the radiation reaches the input end of measuring sensing fiber optic loop 11, whose fiber is wound around the wire 18, which carries the current to be measured. The double, or bifilar, fiber line 17 comprises two adjacent segments of magneto-sensitive fibers with embedded linear birefringence. The direction of propagation of the optical radiation is mutually opposite between these two segments. This embodiment eliminates the influence of external magnetic fields on the state of polarization. This embodiment further ensures maintenance of polarization of the optical radiation during its two opposite passes 17A1-17B1 and 17B2-17A2 through the bifilar fiber line 17.

As the optical radiation passes through the fiber loop 11, which is located in a longitudinal magnetic field of the current in the wire 18, the Faraday effect causes a phase shift between the polarization components (modes) of the optical radiation. The phase shift between the polarization components results in a shift of the azimuth of the electric field vector of radiation. The change in the azimuth angle is proportional to the current carried by the wire 18. The output end of fiber loop 11 is connected to the second arm 17B2 of the second port of the bifilar fiber line 17. After returning from the loop 11 to the bifilar fiber line 17 at point 17B2, the optical radiation exists from the second arm 17A2 of the first port of the bifilar fiber line 17, from which the optical radiation enters the reflector 10 of the optical radiation. The reflector 10 may be implemented as a mirror of optical quality. The reflected optical radiation retraces it optical path in the opposite direction, passing through the bifilar fiber line 17, loop 11, then traversing, in succession, the bifilar fiber line 17, modulator 4, polarizer 3, and coupler 2, from whose arm 2A2 the radiation reaches the photodetector 22. At the output of the coupler 2 the phase shift generated by the current in wire 18 is transferred to a radiation intensity, which is proportional to the current carried by the wire 18.

The photodetector 22 generates an electrical signal, which is proportional to the intensity of the modulated optical radiation. This electrical signal is processed in the signal processing unit 23, whose output is denoted by reference numeral 24.

This output is indicative of the current measured from the wire 18. Specific details of the signal processing unit 23 are omitted for the sake of brevity. It suffices to say that the signal output from the photodetector 22 is an electric signal whose temporal value reflects the temporal value of the current carried by the wire 18. Typically the signal output from the photodetector 22 is subjected to an analogue-to-digital conversion circuit, which may be preceded or succeeded by calibration and/or linearization circuits or numerical processes, but such additional processing stages are not presented as limitations to the actual invention.

As regards departure from the prior art, the key elements of the embodiment shown in FIG. 1 include the construction of the polarization modulator 4, namely the polarization modulator fiber loop 5, around which the solenoid 6 is wound and, optionally, the bifilar fiber line 17. The fiber loop 5, the bifilar fiber line and the measuring fiber optic loop 11 can be made of magneto-sensitive fibers with embedded linear birefringence. This part of the circuit forms a mutual optical interferometer having a common input/output, which is the polarizer 3. In that interferometer, the state of circular polarization is largely preserved, since all its optical elements are made of magneto-sensitive fibers with embedded linear birefringence with the parameters under which the above polarization maintenance is achieved. The linearly polarized optical radiation, comprises left and right orthogonal circular polarization modes of equal intensity. When the linearly polarized optical radiation passes from the polarizer 3 to the reflector 10, it acquires phase shifts between the polarization modes. Some of these phase shifts are benign (useful as far as current measurement is concerned), due to the Faraday effect in the modulator loop 5 and measuring loop 11. On the other hand, some phase shifts, which are caused by the usual delay in the fiber, are undesirable. Upon reflection from the reflector 10, the polarization modes become mutually reversed, which means that the right-hand polarization becomes left-hand polarization and vice versa. Therefore, during the reverse pass from reflector 10 to the polarizer 3, virtually all the unwanted phase shifts are compensated for, while the benign phase shifts are doubled since they are caused by the nonreciprocal Faraday effect. The benign phase shifts include both the modulation component from the signal generator 21, via the solenoid 6 and optical coil 5, and the modulation component proportional to the current to be measured in the wire 18. The benign phase shifts appear at the output of the interferometer, as the linearly polarized radiation coming out of the interferometer has a state of polarization, which varies in proportion to the current in the solenoid 6 and to the current measured in the wire 18. These azimuth changes, after passing through the polarizer 3 to the photodetector 22, are transformed into changes in the radiation intensity. The photodetector 22 generates an electrical signal proportional to the intensity of optical radiation at the input of the signal processing unit 23. Thus the conversion from a phase shift to a change in radiation intensity, as implemented by the polarizer 3 and coupler 2, represents the well-known method of measuring a modulated phase shift, which is proportional to (and, thus, indicative of) the measured current.

The aforementioned magneto-sensitive fiber with an embedded birefringence is characterized by its two main parameters, which jointly determine the current-sensing abilities of the fiber, namely the value of useful magneto-sensitivity and the undesirable effect on it from thermal and mechanical external stresses. These fiber parameters include the beat length of embedded linear birefringence $L_b$ and pitch speed $L_{sp}$. These parameters are selected at the stage of fiber manufacturing.

There are two basic designs of the above magneto-sensitive fiber: conventional (traditional) and microstructure. A magneto-sensitive fiber of the traditional design is obtained from standard anisotropic preparations similar to those used to produce the fiber that maintains linear radiation polarization (PM fiber). Their core and cladding are typically made of doped or undoped silica quartz.

In the microstructural fiber, according to an embodiment of the present invention, the cladding is formed with longitudinal ducts that surround the silica core. The ducts may be filled with gas, such as an inert gas or plain air. The microstructural design ensures several advantages: strong linear birefringence, weak temperature dependence of the latter, low bending loss, etc. The experimental and theoretical findings predetermine selection of the above parameters—the length of the beat and pitch speed at which the optimal result is obtained. Such a fiber is available from the owner of this patent application.

Taking into account the undesirable effect of external influences, the measured angle of rotation of the polarization plane with optical radiation double-pass along the loop is equal to:

$$\phi = 2SVNI \qquad [4]$$

Herein S (S≤1) denotes a normalized relative magneto-sensitivity per one turn. S depends on the parameters of fiber and the fiber strain, in particular, caused by radius R bending at winding in the measuring loop. Reference document [3] includes an analysis of characteristics of magneto-sensitive fibers with embedded linear birefringence was based on a theoretical model of the fiber with spiral structure of the axis of embedded linear birefringence. This analysis showed that sensitivity of the magneto-optical fiber oscillates along the fiber, where the magnitude of the period $L_{osc}$ of spatial oscillations depends on the same fiber parameters $L_b$ and $L_{sp}$. To reduce the influence of external strain on fiber magneto-sensitivity, it is required to have a small value of period $L_{osc}$ not exceeding the value of required spatial interval $L_{\Delta\lambda}$ which occurs because of the finite wavelength range $\Delta\lambda$ of the radiation source. Under this condition, the sensitivity oscillations are not manifested and fiber magneto-sensitivity is the least vulnerable to external deformations.

Figure 2:
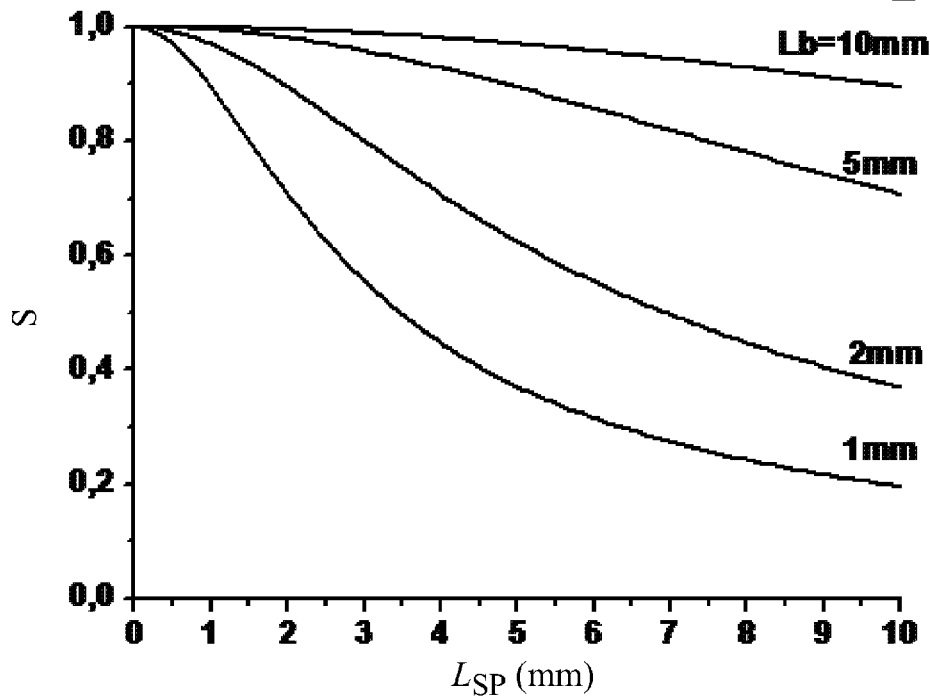
FIG. 2 depicts a normalized sensitivity S of the magneto-sensitive optical fiber as a function of pitch speed $L_{sp}$ for various values of beat length of embedded linear birefringence $L_b$.
Figure 4:
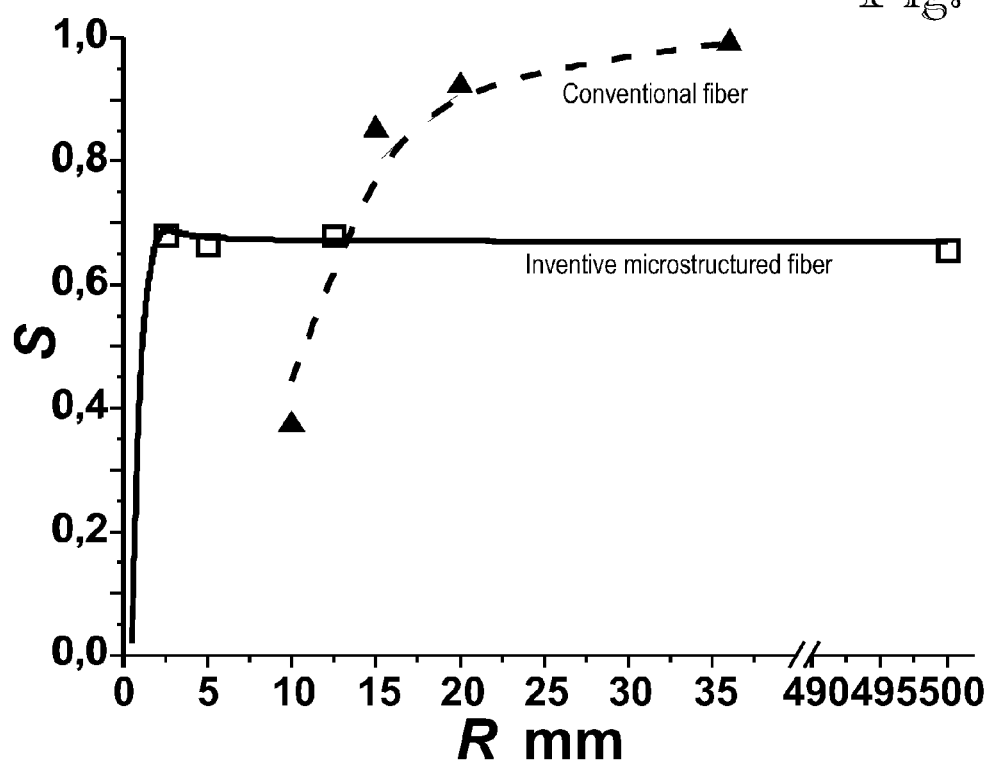
FIG. 4 depicts the normalized sensitivity S of the magneto-sensitive optical fiber as a function of bending radius R.

FIG. 2 shows estimated dependences $S(L_{sp})$ at various values of $L_b$ for a spun fiber with a large bending radius. In the present context, a large bending radius means that birefringence induced by bending must be significantly smaller than the embedded birefringence for the fiber. From FIG. 2 it is clear that the maximum sensitivity could be achieved for small values of $L_{sp}$ and relatively high values of $L_b$. Additional constraints may be present in certain real-life applications. For example, the drawing process for the practical spun fiber should preferably not yield $L_{sp}$ values shorter than, say, 1 to 2 mm, and even a value of 1 mm is very difficult to achieve. Thus one should take this fact into account while designing the fiber parameters and the $L_{sp}$ value should be maintained in a sensible range. Another constraint relates to the obvious circumstance that the sensitive fibre for the current sensor must be coiled and hence has a finite bending radius. Such bending affects the value of the S parameter. If the birefringence induced by bending is comparable to or higher than the embedded fibre birefringence, the S value could be significantly lower than 1. The example of such bending effect on the S parameter for 2 different fibres obtained by the inventors theoretically and experimentally is shown in FIG. 4 (see below). Fibers with appropriately chosen parameters, as described above, have a high magneto-sensitivity that is close to the ultimate value for the fiber material (eg silica quartz), and are highly resistant to thermal and mechanical effects, which allows obtaining a stable and accurate scaling factor for the current sensor. On the basis of theoretical considerations, and as confirmed by laboratory experiments, the inventors consider the following range of parameters optimal for a practical current sensor design: the embedded beat length $L_b$ is 1 mm to 10 mm and spinning pitch $L_{sp}$ from 1 mm to 5 mm. The particular ratio of $L_b/L_{sp}$ should be determined from a particular sensing coil design and parameters (coil diameter, number of turns, etc.)

A working example of the embodiment shown in FIG. 1 will be described next. As the light source 1, a fiber radiation source made of erbium-doped fiber was used, with a power of 30 mW at a wavelength of 1.55 μm and a radiation spectral width of 20 nm. As the fiber for the polarization modulator 4, fiber line 17 and measuring sensing loop 11, a microstructured magneto-sensitive fiber was used, with embedded birefringence with parameters $L_b$=5 mm and $L_{sp}$=3.5 mm. All these elements were made from a single piece of fiber without seams. The polarization modulator 4 contained 10,000 turns of fiber wound on a circular frame 100 mm long with an outer radius of 10 mm. The solenoid 6 had 48 turns of copper wire, 1 mm in diameter, passed along the fiber frame's internal opening. An alternating current of 3 A with a frequency of 40 kHz was applied to the solenoid 6. This implementation of the polarization modulator 4 achieved a modulation amplitude of 1.84 radian, which as adequate for a normal operation of the electronic portion of the apparatus. No spurious signals could be observed at the modulation frequency. The bifilar line 17 had a length of 2 m. The measuring loop 11 consisted of 3000 turns of fiber wound on a circular frame 30 mm long with an outer radius of 10 mm. The electronic unit for processing of photodetector output signal 24, which allows measuring a phase shift proportional to current, may be constructed as described in reference document [3].

Figure 3:
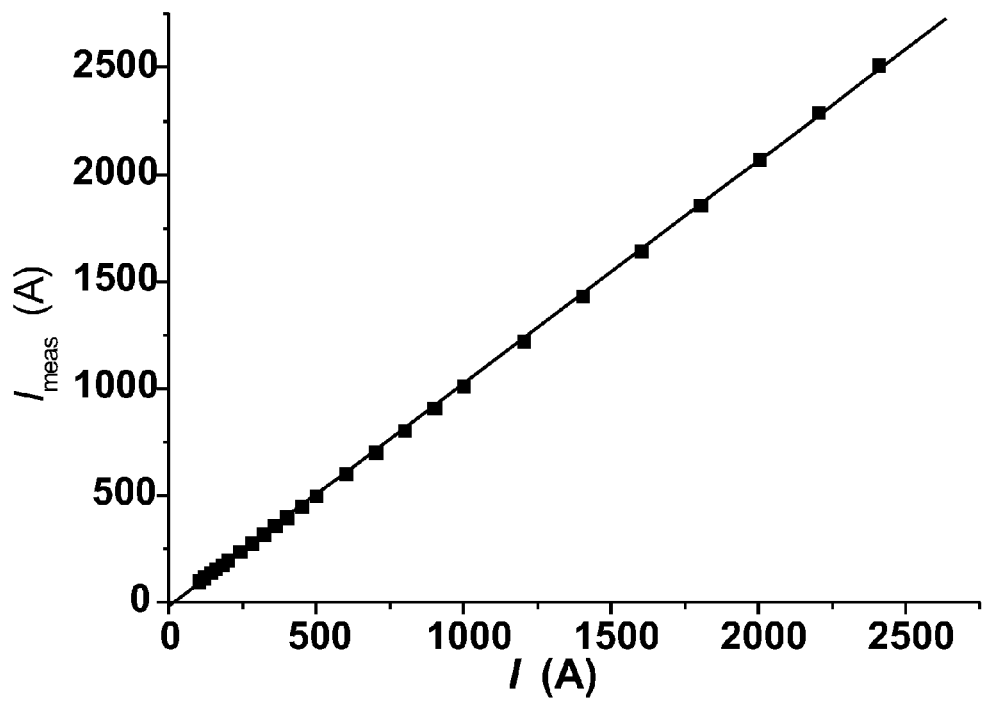
FIG. 3 shows the output characteristics of the current sensor.

FIG. 3 shows the output characteristics of the current sensor, or in other words, the measured current $I_{meas}$ (the apparent current as indicated by the laboratory model), as a function of the current I flowing in the current-carrying wire 18. As shown in FIG. 3, the tested laboratory model achieved a very good linearity over a wide range of current values, which demonstrates the feasibility of the invention. This working example had a relatively high number of turns, and lower number may provide adequate sensitivity for less critical applications.

Additionally, the effect of mechanical perturbations (fiber bending strain) on the sensitivity of magneto-optical fibers with embedded linear birefringence was measured. In this measurement, several sensing measurement loops were employed. The measurement loops were made of a microstructured fiber with specified parameters of $L_b$=1 mm and $L_{sp}$=3.5 mm, wound on frames of different diameters. Each loop was tested as a measuring sensing loop in the current sensor model.

FIG. 4 depicts the normalized sensitivity S of the magneto-sensitive optical fiber as a function of bending radius R (shown with rectangles for the microstuctured fiber disclosed herein). For comparison, a second set of measurements was performed for magneto-sensitive fibers with embedded linear birefringence of a traditional design, with parameters $L_b$=15 mm and $L_{sp}$=2.5 mm. These measurements are shown by black triangles. This set of experiments shows that a fiber with parameters $L_b$=1 mm and $L_{sp}$=3.5 mm is close to optimal as regards dependence on bending radius. A microstructured fiber with parameters of $L_b$=1 mm and $L_{sp}$=3.5 mm maintains a constant normalized sensitivity down to a bending radius of 2.5 mm, which exceeds the performance of the traditional fiber (R≥20 mm) by a factor of eight.

Thus, for a given length of fiber, the microstructured fiber with parameters of $L_b$=1 mm and $L_{sp}$=3.5 mm allows winding the fiber loop with a number of turns eight times higher than that of the conventional fiber. On the other hand, this type of microstructured fiber has a normalized sensitivity per turn which is approximately 70% of the sensitivity of conventional fiber. By combining the eight-fold increase in the number of turns and the 30% loss in sensitivity per turn, it turns out that this type of microstructured fiber can increase sensor sensitivity can be increased by a factor of about five. Furthermore, the use of microstructured fiber helps reduce the effect of temperature on the accuracy of current sensors. Therefore, the specified microstructured fiber increases the sensitivity and precision of the fiber-optic current sensor and decreases errors caused by current measurement caused by external temperature and mechanical perturbations.

Figure 5:
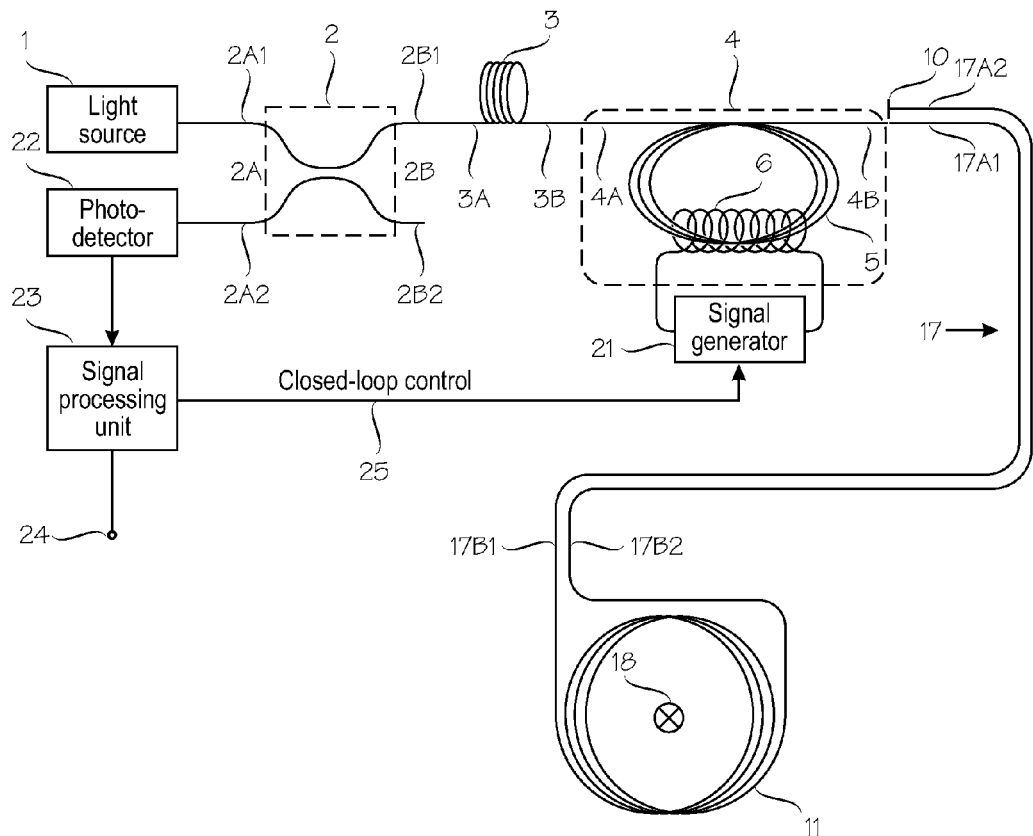
FIG. 5 shows a variation of the embodiment shown in FIG. 1.

FIG. 5 shows a variation of the embodiment shown in FIG. 1. As shown in FIG. 5, the signal processing unit 23 produces a closed-loop control signal 25. As disclosed in connection with the prior art (FIG. 1B of Reference [2]), such a closed-loop control produces a phase nulling current. In the prior art, the phase nulling current passes through the optimized sensor coil (shown herein as item 11) producing a substantially equal and opposite effect to that produced by the current in current carrying wire 18. With this method of operation, the non-reciprocal phase shift induced in the current sensor is kept very small, allowing for a very high sensitivity sensing coil to be employed without encountering non-linearities associated with detecting large phase shifts. A residual problem with the closed-loop operation disclosed in the prior art is caused by the fact that the current generator (item 23 in the prior art) drives an additional electromagnetic coil in the vicinity of the current-carrying wire 18. Because the current-carrying wire is often a high-voltage line, the closed-loop operation disclosed in the prior art suffers from the problem that electric isolation demands may be difficult to meet. This residual problem is solved in the present embodiment in that the closed-loop control current 25 drives an electromagnetic coil which may be located far away and is properly insulated from the current-carrying wire 18.

In the embodiment shown in FIG. 5, the closed-loop control current 25 is combined with the modulation current in the signal generator 21, such that the phase-nulling effect is achieved. In an alternative implementation (not shown separately), the closed-loop control current 25 drives a solenoid separate from the solenoid 6, which is employed by the signal generator 21 for its polarization-modulation function.

Figure 6:
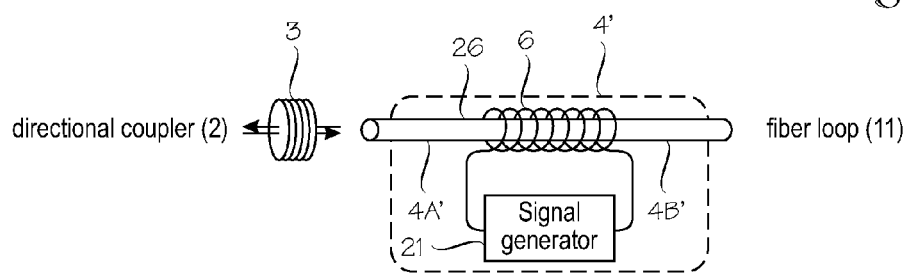
FIG. 6 shows an alternative implementation for the polarization modulator, wherein a modified optical garnet element is used in place of the modulator fiber loop.

FIG. 6 shows an alternative implementation for the polarization modulator, shown here as element 4'. Reference numerals 4A' and 4B' denote the two ports of the polarization modulator 4'. Overall, the polarization modulator 4' performs the same function as the polarization modulator 4 described in connection with the previous embodiments.

In this implementation, a modified magnetic garnet optical element, denoted by reference numeral 26, is used in place of the modulator fiber loop 5. A conventional magnetic garnet optical element, such as an optical isolator, employs a permanent magnet to alter the polarization of radiation propagating via the garnet. According to the present embodiment, the permanent magnet is replaced by the solenoid 6, analogously with the previous embodiments. A departure from the previous embodiments is that a magnetic garnet 26 is used instead of the modulator fiber loop 5. A polarizer 3 is installed between the magnetic garnet element 26 and the directional coupler 2.

As to the construction of the magnetic garnet, terbium (Tb) may be used, possibly doped with materials such as gallium.

The inventors have demonstrated the feasibility of this embodiment with a Tb3Ga5O15 terbium gallium garnet cylinder having a Verdet constant of 0.2°/Oe·mm. The length and diameter of the cylinder were 50 mm and 10 mm, respectively. The solenoid 6 was formed by winding 50 turns/cm in five layers, such that the total length of the wire was about 20 m. At a current of 3 A, the power dissipation was 4.5 W. The polarization modulator thus constructed exhibited a phase modulation capability of 1.8 radians at a wavelength of 1.06 µm.

The above description of the specific embodiments is illustrative rather than restrictive. It is apparent to those skilled in the art that with advancing technology, the invention can be implemented in various embodiments. Accordingly, the scope of protection is defined by the following claims.

Reference Documents
1. R. I. Laming, D. N. Payne. "*Electric current sensors employing spun highly birefringent optical fibers*", J. of Lightwave Technology, 7, No. 12, 2084-2094 (1989).
2. U.S. Pat. No. 6,188,811.
3. V. P. Gubin, V. A. Isaev, S. K. Morshnev, A. I. Sazonov, N. I. Starostin, Yu. K. Chamorovsky, and A. I. Usov. "*Use of Optical Fibers of Spun Type in Current Sensors.*"Quant. Electron. 36, No. 3, 287-291 (2006).
4. U.S. Pat. No. 5,568,049. Not discussed in the detail in the patent specification but discloses the use of a solenoid for measuring a magnetic field.

The invention claimed is:

1. A fiber-optic current sensor for sensing an electric current carried in an electric conductor (18), the fiber-optic current sensor comprising an optical section and an electronic section;
  wherein the optical section comprises:
    a light source (1);
    a directional coupler (2) with a first port (2A) and a second port (2B), each port comprising a first arm (2A1, 2B1) and a second arm (2A2, 2B2);
    a radiation polarizer (3) with a first port (3A) and a second port (3B);
    a polarization modulator (4) with a first port (4A) and a second port (4B),
    a fiber line (17) coupled to a current-sensing fiber loop (11) having a first end and a second end;
    a radiation reflector (10);
    a photodetector (22);
    wherein
    one arm (2A1) of the first port of the directional coupler (2) is coupled to the light source (1) while the other arm 2A2 of the first port of the directional coupler (2) is coupled to the photodetector (22);
    one arm (2B1) of the second port of the directional coupler (2) is coupled to the first port (3A) of the radiation polarizer;
    the second port (3B) of the radiation polarizer is coupled to the first port (4A) of the polarization modulator;
    the polarization modulator (4) comprises a magneto-sensitive element (5, 26), around which a solenoid (6) is wound;
    the current-sensing fiber loop (11) is made of magneto-sensitive optical fiber with an embedded linear birefringence;
    and wherein the electronic section comprises:
    a signal generator (21) configured to drive the solenoid (6); and
    a signal processing (23) unit configured to receive an electrical signal from the photodetector (22).

2. The fiber-optic current sensor according to claim 1, wherein:
  the fiber line (17) is a bifilar fiber line having a first port with a first arm (17A1) and second arm (17A2) and a second port with a first arm (17B1) and a second arm (17B2);
  the second port (48) of the polarization modulator is coupled to the first arm (17A1) of first port of the bifilar fiber line (17);
  the first and second arms (17B1, 17B2) of the second port of the bifilar fiber line (17) are respectively coupled to the first end and second end of the current-sensing fiber loop (11);
  the second arm (17A2) of the first port of the bifilar fiber line (17) is coupled to the radiation reflector (10).

3. The fiber-optic current sensor according to claim 1, wherein the magneto-sensitive element (5) comprises a modulator fiber segment.

4. The fiber-optic current sensor according to claim 2, wherein the magneto-sensitive element (5) comprises a modulator fiber segment, which forms a unitary fiber with the bifilar line (17) and the current-sensing fiber loop (11).

5. The fiber-optic current sensor according to claim 1, wherein the magneto-sensitive element (5) comprises a magnetic garnet optical element (26).

6. The fiber-optic current sensor according to claim 1, wherein the magneto-sensitive optical fiber with the embedded linear birefringence has an embedded beat length $L_b$ from 1 mm to 10 mm, and a spinning pitch $L_{sp}$ from 1 mm to 5 mm.

* * * * *